(12) United States Patent
Cheng et al.

(10) Patent No.: US 8,741,701 B2
(45) Date of Patent: Jun. 3, 2014

(54) FIN STRUCTURE FORMATION INCLUDING PARTIAL SPACER REMOVAL

(75) Inventors: Kangguo Cheng, Schenectady, NY (US); Bruce B. Doris, Brewster, NY (US); Ali Khakifirooz, Mountain View, CA (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/585,395

(22) Filed: Aug. 14, 2012

(65) Prior Publication Data

US 2014/0051247 A1  Feb. 20, 2014

(51) Int. Cl.
*H01L 21/335* (2006.01)
*H01L 21/8232* (2006.01)

(52) U.S. Cl.
USPC ............ 438/142; 438/167; 438/689; 438/745

(58) Field of Classification Search
None
See application file for complete search history.

(56) References Cited

U.S. PATENT DOCUMENTS

| | | | |
|---|---|---|---|
| 5,688,713 A * | 11/1997 | Linliu et al. ................. | 438/253 |
| 6,987,289 B2 | 1/2006 | Nowak | |
| 7,315,994 B2 | 1/2008 | Aller et al. | |
| 7,323,374 B2 | 1/2008 | Beintner et al. | |
| 7,517,764 B2 | 4/2009 | Booth, Jr. et al. | |
| 7,763,531 B2 * | 7/2010 | Abadeer et al. ............... | 438/532 |
| 2011/0204419 A1 | 8/2011 | Johnson et al. | |
| 2012/0235247 A1 * | 9/2012 | Cai et al. ........................ | 257/392 |

OTHER PUBLICATIONS

H. Kawasaki et al., "Challenges and solutions of FinFET integration in an SRAM cell and a logic circuit for 22 nm node and beyond," 2009 IEEE International Electron Devices Meeting (IEDM), Dec. 7-9, 2009, 4 pages.
A. Keshavarzi et al., "Architecting advanced technologies for 14nm and beyond with 3D FinFET transistors for the future SoC applications," 2011 IEEE International Electron Devices Meeting (IEDM), Dec. 5-7, 2011, pp. 4.1.1-4.1.4 (1-4).
K. Maitra et al., "Aggressively Scaled Strained-Silicon-on-Insulator Undoped-Body High-k /Metal-Gate nFinFETs for High-Performance Logic Applications," IEEE Electron Device Letters, vol. 32, Issue 6, Jun. 2011, pp. 713-715.
T. Yamashita et al., "Sub-25nm FinFET with advanced fin formation and short channel effect engineering," 2011 Symposium on VLSI Technology (VLSIT), Jun. 14-16, 2011, pp. 14-15.

* cited by examiner

*Primary Examiner* — Duy Deo
(74) *Attorney, Agent, or Firm* — Cantor Colburn LLP; Vazken Alexanian (57) ABSTRACT

A method of forming a semiconductor device includes forming a mandrel on top of a substrate; forming a first spacer adjacent to the mandrel on top of the substrate; forming a cut mask over the first spacer and the mandrel, such that the first spacer is partially exposed by the cut mask; partially removing the partially exposed first spacer; and etching the substrate to form a fin structure corresponding to the partially removed first spacer in the substrate.

12 Claims, 15 Drawing Sheets

FIN STRUCTURE FORMATION INCLUDING PARTIAL SPACER REMOVAL

BACKGROUND

This disclosure relates generally to semiconductor device fabrication, and more particularly to fin structure formation including partial spacer removal for formation of a semiconductor device.

Field effect transistors (FETs) are used to make semiconductor chips for various applications, such as application specific integrated circuit (ASIC) chips, microprocessor chips, and static random access memory (SRAM) chips. Complementary metal-oxide-semiconductor (CMOS) processing technology is used to form FET devices.

Technology advances have scaled FETs on semiconductor chips to increasingly small dimensions, allowing power per logic gate to be dramatically reduced, and further allowing a very large number of FETs to be fabricated on a single semiconductor chip. However, scaling of FETs runs into physical limitations. Gate oxides have become thin enough that leakage occurs through the gate oxides. Further scaling of gate oxide thickness may cause an exponential increase in leakage. Power dissipated by leakage currents has become a significant portion of total chip power, and an exponential increase in leakage results in unacceptable power dissipation for many types of chips.

A finFET is a type of FET device that utilizes three dimensional techniques to pack a large number of FETs in a given area of a semiconductor chip while reducing some of the problems described above. A finFET may include a relatively tall, thin semiconductor fin structure comprising a semiconductor material. Formation of a finFET fin structure may include forming mandrels on a substrate, forming spacers around the mandrels, removing the mandrels, and etching the spacer pattern into the substrate to form the fin structures. A cut mask may then be applied to the fin structures to remove any portions of the fin structures that are undesired in the finFET device. However, application of a cut mask to the fin structures may have a relatively small margin of error, and misalignment of the cut mask to a fin structure that is being removed may lead to undesired cutting of adjacent fin structures.

SUMMARY

In one aspect, a method of forming a semiconductor device includes forming a mandrel on top of a substrate; forming a first spacer adjacent to the mandrel on top of the substrate; forming a cut mask over the first spacer and the mandrel, such that the first spacer is partially exposed by the cut mask; partially removing the partially exposed first spacer; and etching the substrate to form a fin structure corresponding to the partially removed first spacer in the substrate.

In another aspect, a method of forming a semiconductor device includes forming a plurality of mandrels on top of a substrate; forming a plurality of spacers on top of the substrate, wherein each of the plurality of spacers is located adjacent to one of the plurality of mandrels; forming a cut mask over the plurality of mandrels and the plurality of spacers, such that a first portion of the plurality of spacers are exposed by the cut mask, and a second portion of the plurality of spacers are covered by the cut mask; removing the first portion of the plurality of spacers; removing the cut mask; removing the plurality of mandrels after removing the cut mask; and etching the substrate to form a plurality of fin structures corresponding to the second portion of the plurality of spacers in the substrate.

In another aspect, a semiconductor device precursor structure, includes a substrate; a first spacer located on top of a first portion of the substrate; and a second spacer located on top of a second portion of the substrate, adjacent to the first spacer; and a cut mask located over the first spacer and the second spacer, wherein the first spacer is partially exposed by the cut mask and wherein the second spacer is fully covered by the cut mask, and wherein a width of the first spacer is the same as a width of the second spacer, and a height of the first spacer is less than a height of the second spacer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of methods for fin structure formation including partial spacer removal, and a device formed by methods for fin structure formation including partial spacer removal, are provided, with exemplary embodiments being discussed below in detail. The cut mask may be applied to the spacers and the mandrels before mandrel removal. If there is cut mask misalignment and a spacer corresponding to a fin structure that needs to be present in the final device is partially exposed by the cut mask, the cut mask and the mandrel adjacent to the spacer may together protect the partially exposed spacer during spacer removal, such that the partially exposed spacer is only partially removed. The partially removed spacer may then be used to form a corresponding fin structure in the substrate. In some embodiments, the fin structures may comprise a semiconductor material such as silicon for a finFET device. In other embodiments, the fin structures that are formed using partial spacer removal may comprise gates, conductive lines, or dielectric lines.

The height of the spacers may be significantly greater than the width of the spacers. For example, a spacer may be about 10 nanometers (nm) wide, and from about 70 nm tall to about 100 nm tall, in some embodiments. Because the mandrel and the cut mask both protect the partially exposed spacer during the spacer etch, only a top portion of the partially exposed spacer may be removed. Therefore, a partially removed spacer is shorter than a non-partially-removed spacer, but has the same width. This results in formation of a fin structure in the substrate corresponding to the partially removed spacer that has the same dimensions as a fin structure that is formed using a non-partially-removed spacer, as, while the fin structure width is determined by the spacer width, the fin structure height is independent of the spacer height. The partially removed spacer only needs to have sufficient height to withstand the etching of the spacer pattern into the substrate.

Figure 1:
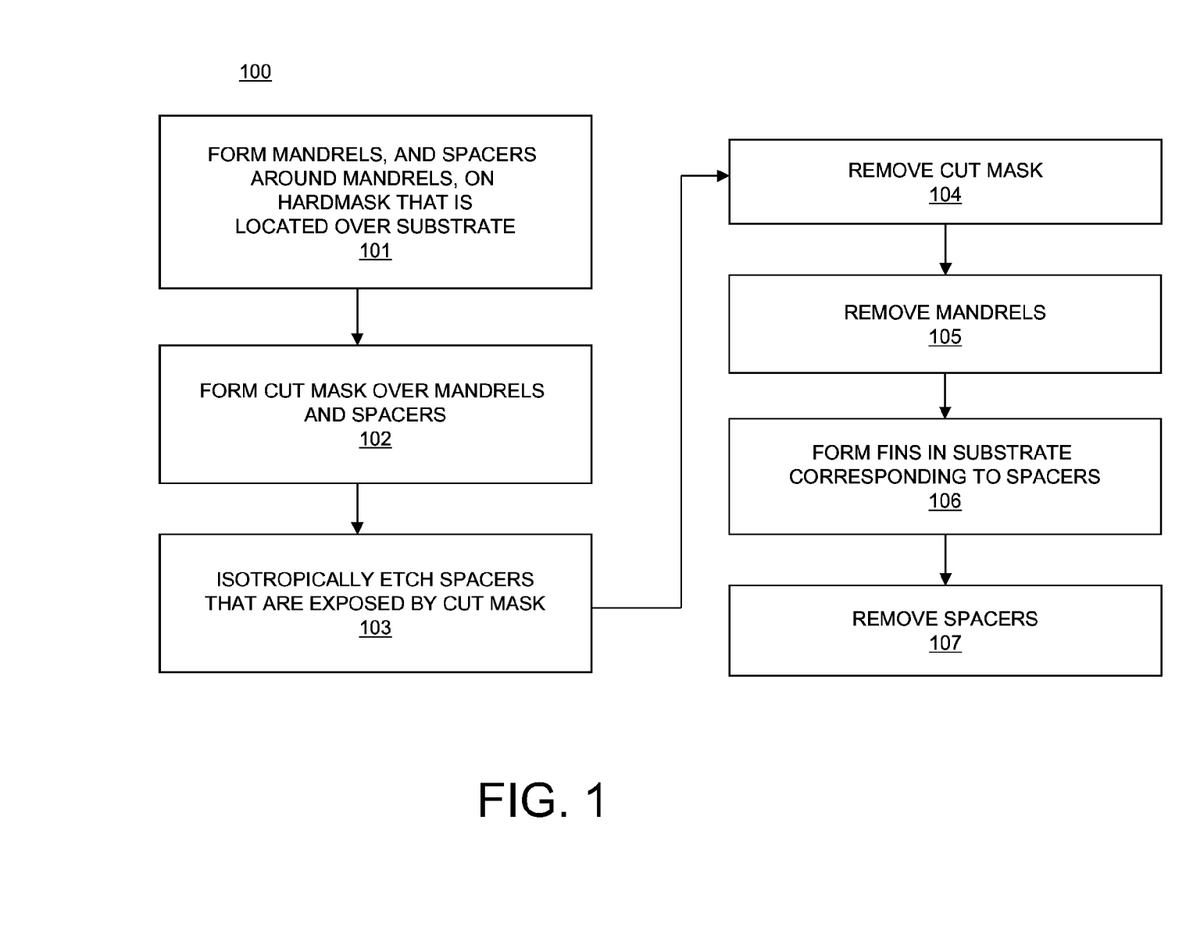
FIG. 1 is a flowchart illustrating an embodiment of a method for fin structure formation including partial spacer removal.
Figure 2A:
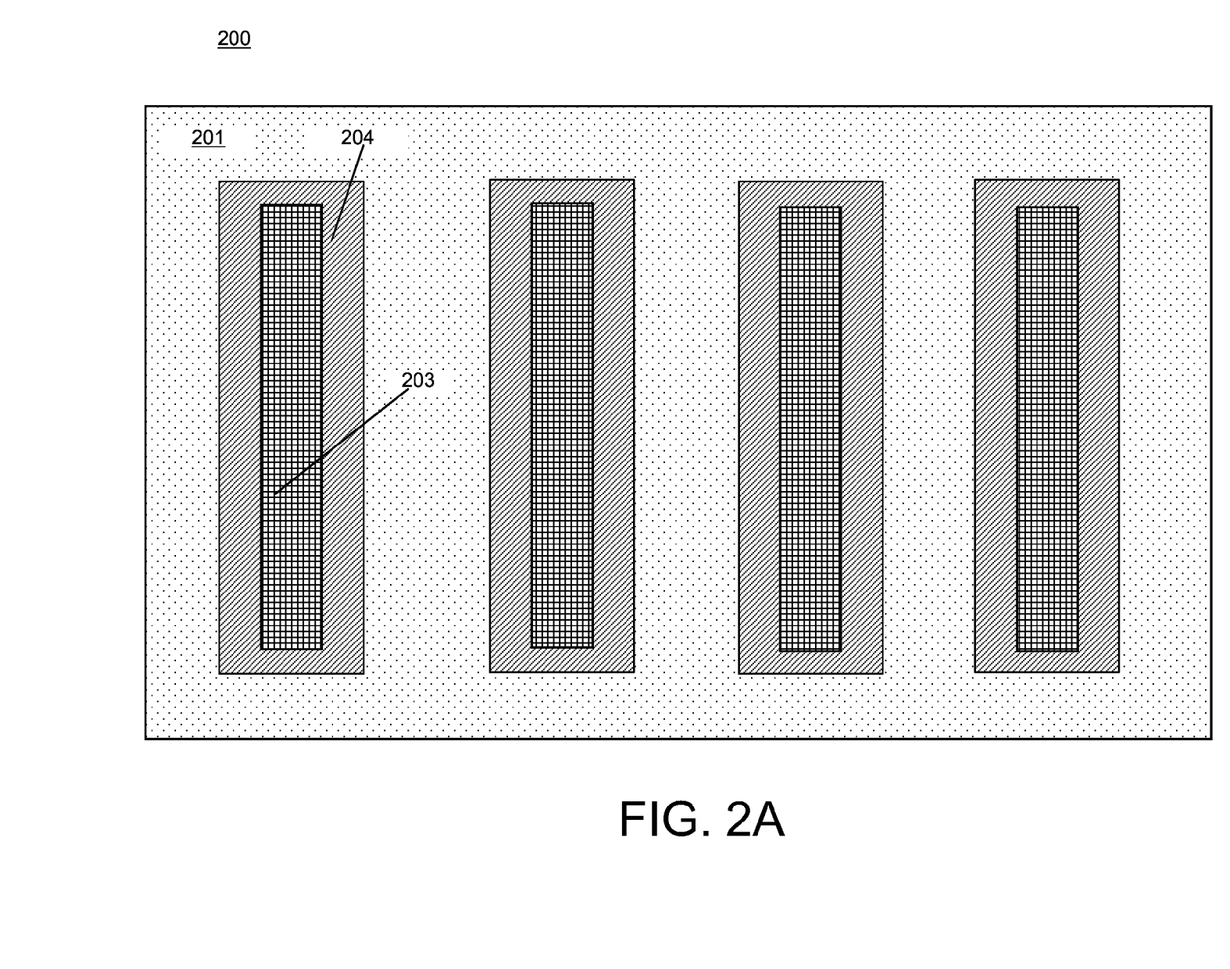
FIG. 2A is a top view of a device including a substrate with mandrels and spacers formed thereon.
Figure 2B:
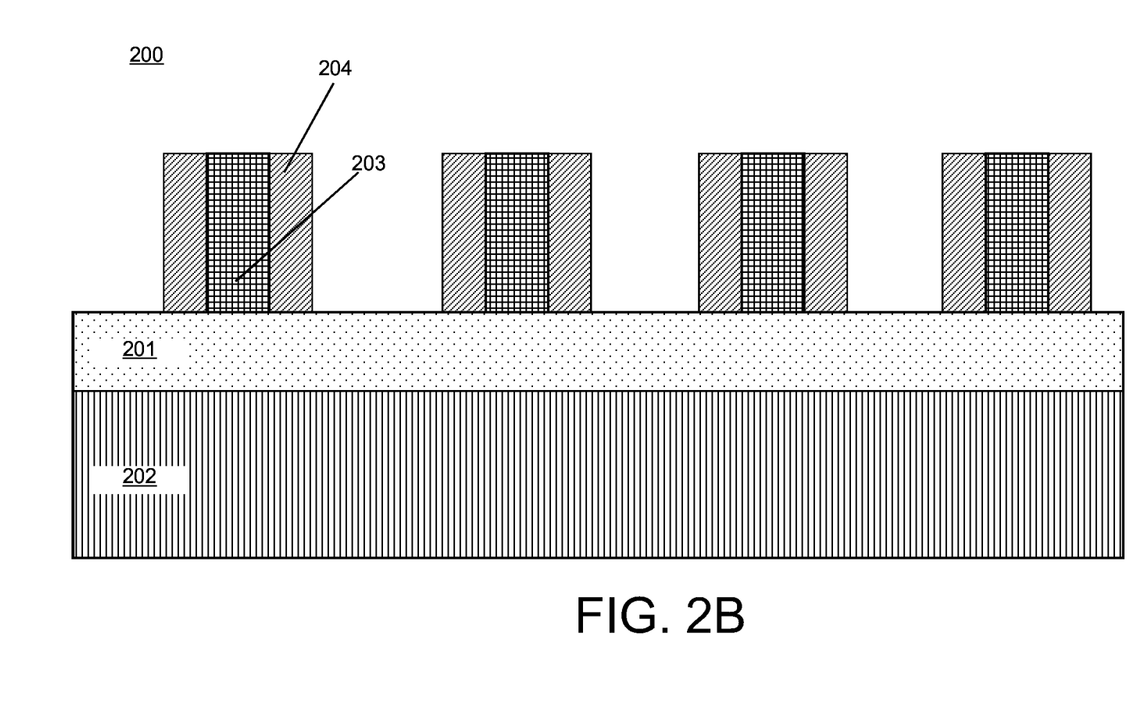
FIG. 2B is a cross section of the device shown in FIG. 2A.

FIG. 1 illustrates a flowchart of an embodiment of a method 100 for fin structure formation including partial spacer removal. In some embodiments, fin structures that are formed using method 100 may comprise a semiconductor material, while in other embodiments, the fin structures that are formed by method 100 may comprise gates, conductive lines, or dielectric lines. FIG. 1 is discussed with reference to FIGS. 2A and 2B through 8A and 8B. First, in block 101, mandrels and spacers that surround the mandrels are formed on a hardmask layer that is located on a substrate. The hardmask, mandrels, and spacers may each comprise any appropriate material and may be formed over the substrate in any appropriate manner. In some embodiments, the spacers may be formed using a sidewall image transfer (SIT) technique. In some embodiments, the mandrels may be polysilicon, the spacers may be nitride, and the hardmask may be oxide. In other embodiments, the hardmask may comprise nitride, the mandrels may comprise amorphous carbon, and the spacers may comprise a metal, such as titanium nitride (TiN), or oxide. In various embodiments, the substrate may comprise a bulk silicon substrate or a silicon-on-insulator (SOI) substrate. In further embodiments, the substrate may also include various semiconductor device structures, including but not limited to isolation regions comprising dielectric material, gate material, and/or metal contacts. FIGS. 2A and 2B illustrate, respectively, a top view and cross-section of an embodiment of a device 200 with mandrels 203 that are surrounded by spacers 204. The mandrels 203 and spacers 204 are located on a hardmask 201, and hardmask 201 is located on top of a substrate 202. In some embodiments, mandrels 203 are polysilicon, spacers 204 are a nitride, and hardmask 201 is an oxide. FIG. 2 is shown for illustrative purposes only; a device including mandrels and spacers on a substrate that is formed during block 101 of FIG. 1 may have any appropriate number of mandrels and associated spacers, and the mandrels and spacers may have any appropriate configuration.

Figure 3A:
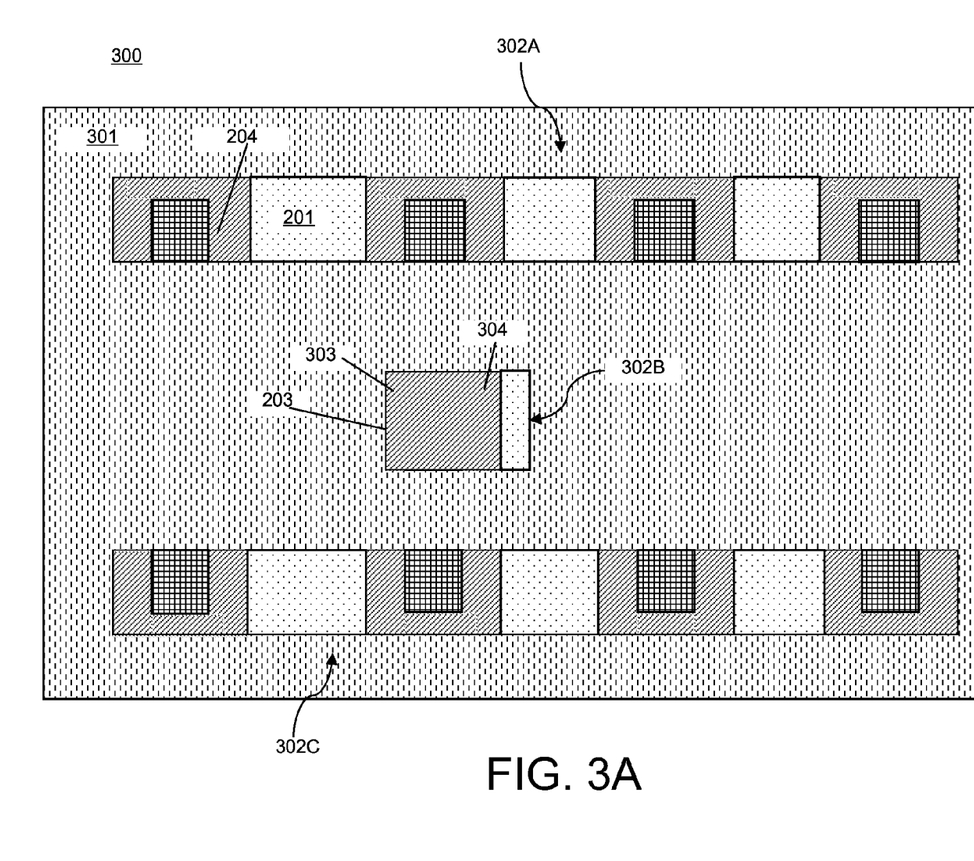
FIG. 3A is a top view of the device of FIG. 2A after formation of a cut mask over the mandrels and spacers.
Figure 3B:
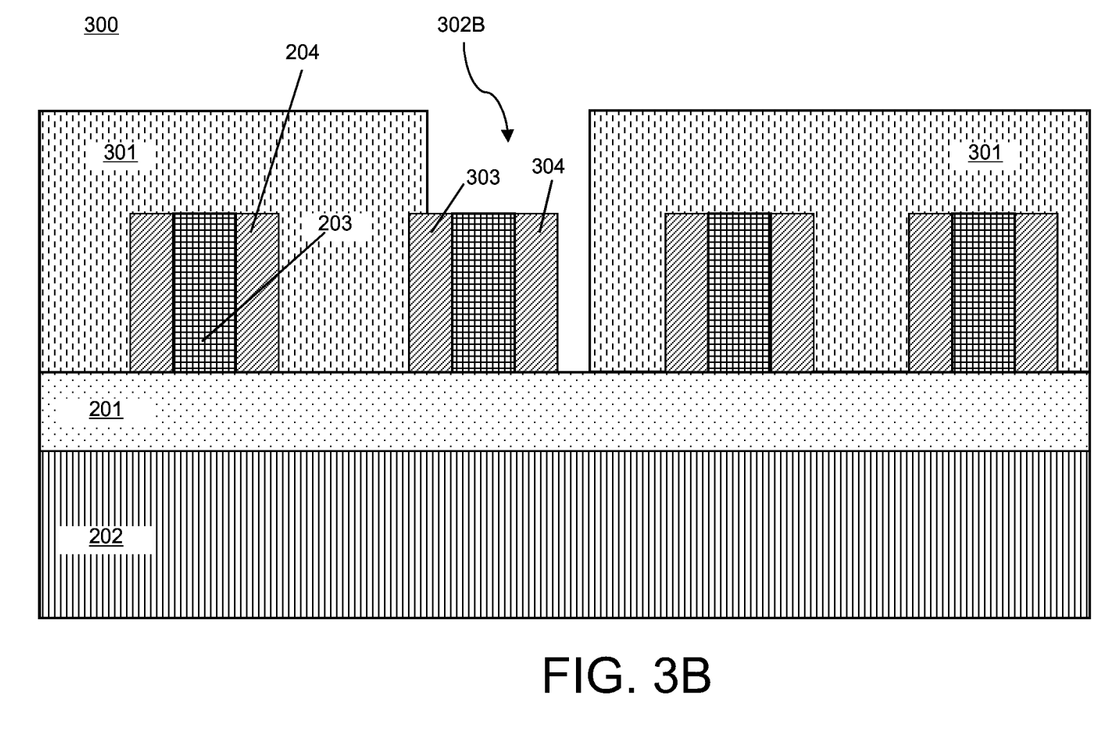
FIG. 3B is a cross section of the device of FIG. 2B after formation of a cut mask over the mandrels and spacers.

Flow of method 100 proceeds from block 101 to block 102, in which a cut mask is formed over the mandrels and spacers. The cut mask defines exposed areas of the finished device in which a fin structure is not desired. The cut mask may comprise photoresist in some embodiments, and may be formed by applying a layer of photoresist over the device, exposing the layer of photoresist to light through a mask, and removing the portions of the photoresist that were exposed to the light. In other embodiments, the cut mask my comprise spin-on-glass that is patterned using lithography and etching. FIGS. 3A and 3B show the device 200 of FIGS. 2A and 2B after formation of a cut mask 301 over the mandrels 203 and the spacers 204. Portions of the mandrels 203 and spacers 204 are exposed by cut mask 301 in exposed areas 302A, 302B and 302C, such as fully exposed spacer 304 in exposed area 302B, a cross section of which is shown in FIG. 3B. The cut mask 301 may be misaligned to the spacers 204, as illustrated by partially exposed spacer 303 in exposed area 302B. Partially exposed spacer 303 is located partially underneath the cut mask 301. Cut mask 301 of the semiconductor device precursor structure of FIG. 3 is shown for illustrative purposes only; a cut mask may cover any appropriate areas of a device, and may fully and/or partially expose any appropriate amount of spacers.

Figure 4A:
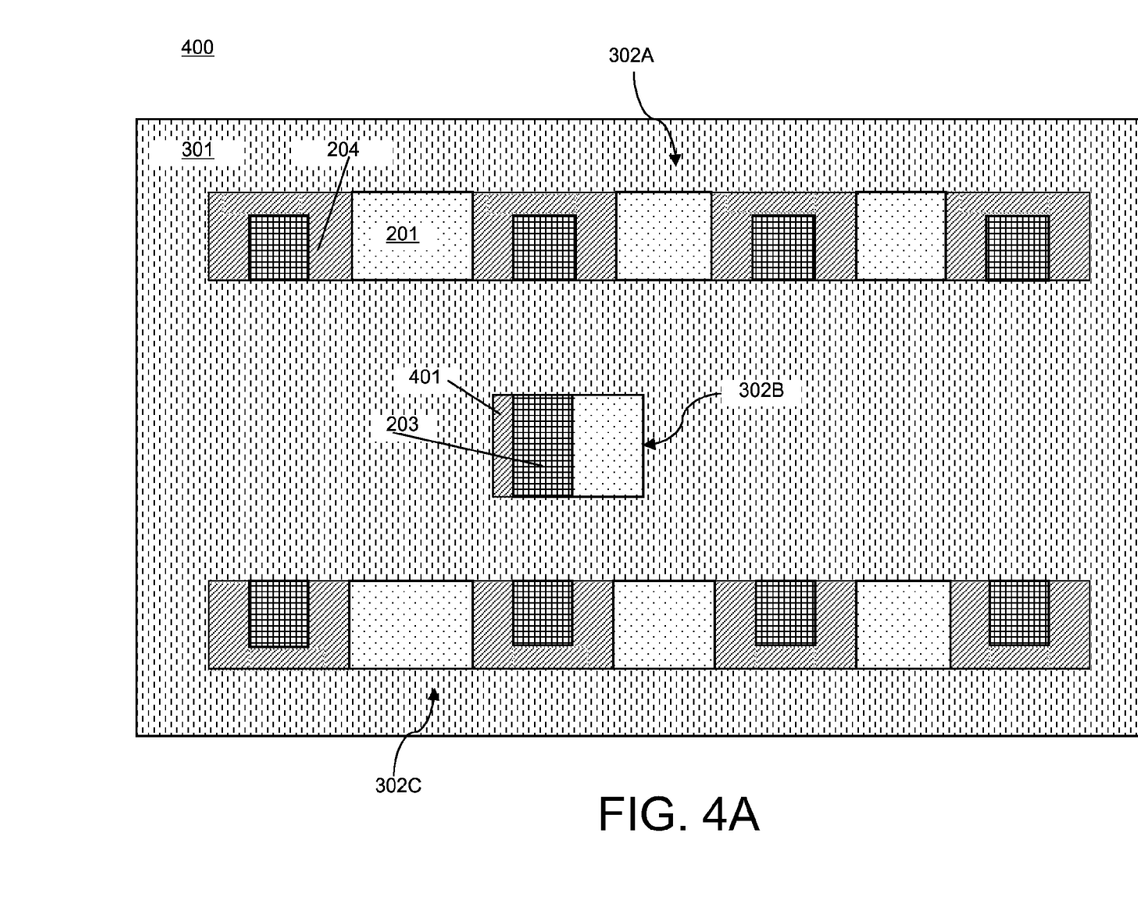
FIG. 4A is a top view of the device of FIG. 3A after etching of the spacers that are exposed by the cut mask.
Figure 4B:
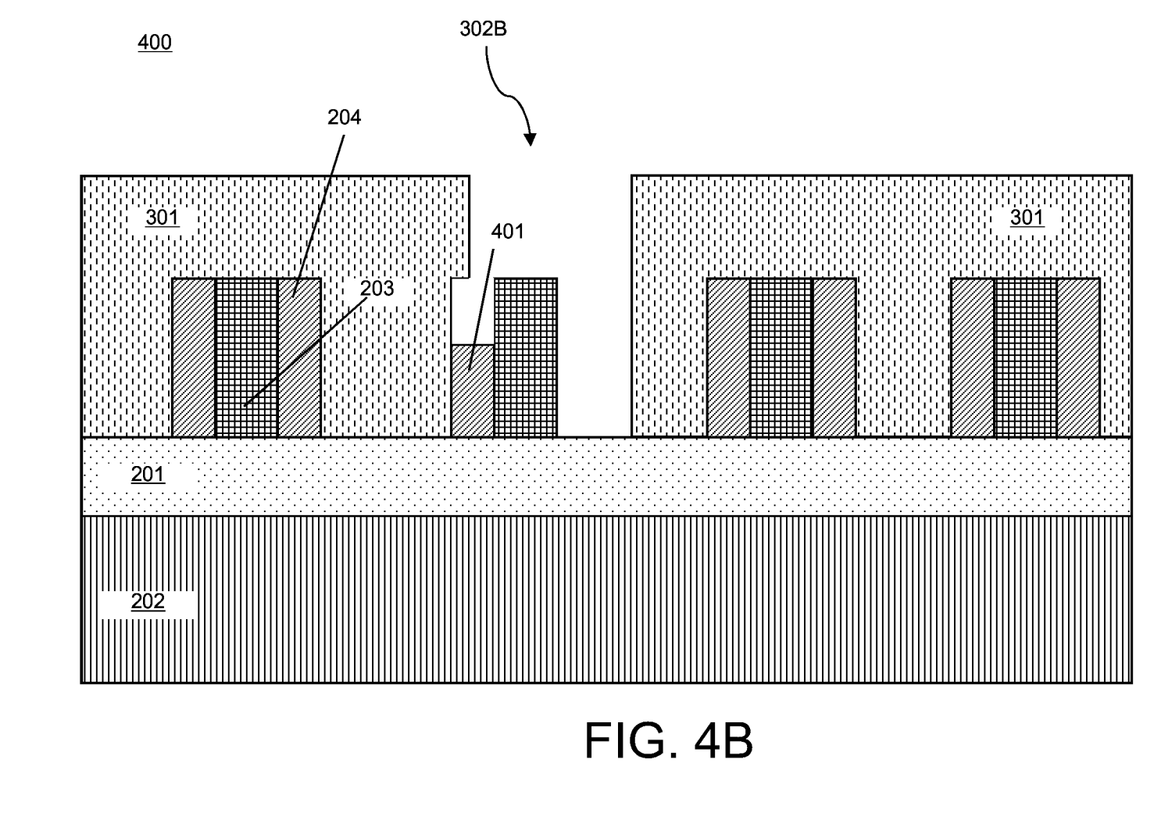
FIG. 4B is a cross section of the device of FIG. 3B after etching of the spacers that are exposed by the cut mask.

Next, in block 103 of FIG. 1, the spacers that are located in the exposed areas are etched. Etching of the spacers comprises an isotropic etch, and may comprise any appropriate etch chemistry. In some embodiments, the etch that is performed during block 103 of method 100 may include a wet etch with an etch solution comprising a phosphoric acid ($H_3PO_4$) etch or a dry etch such as chemical downstream etch with an etchant comprising $CH_3F$, $CH_2F_2$, and/or $CF_4$ in conjunction with $O_2$. The fully exposed spacers in the exposed areas are fully removed by the spacer etch that is performed during block 103, while the partially exposed spacers are only partially removed. The partially exposed spacers are only partially removed because the partially exposed spacers are protected by adjacent mandrels and partially covered by the cut mask during the spacer etch of block 103. FIGS. 4A and 4B show the device 300 of FIGS. 3A and 3B after etching of the spacers 204 (including partially exposed spacer 303 and fully exposed spacer 304 in exposed area 302B of FIGS. 3A and 3B) in the exposed areas 302A, 302B and 302C. Any spacers 204 in exposed areas 302A, 302B and 302C such as fully exposed spacer 304 in exposed area 302B, that were fully exposed by cut mask 301 are completely removed by the spacer etch that is performed in block 103, exposing hardmask 201. The partially exposed spacer 303 in exposed area 302B that was shown in FIGS. 3A and 3B is only partially removed by the spacer etch, forming partially removed spacer 401. Partially removed spacer 401 has a height that is less than the height of spacers 204 that were fully covered by the cut mask 301 during the spacer etch of block 103, and a width that is the same than the width of covered spacers 204.

Figure 5A:
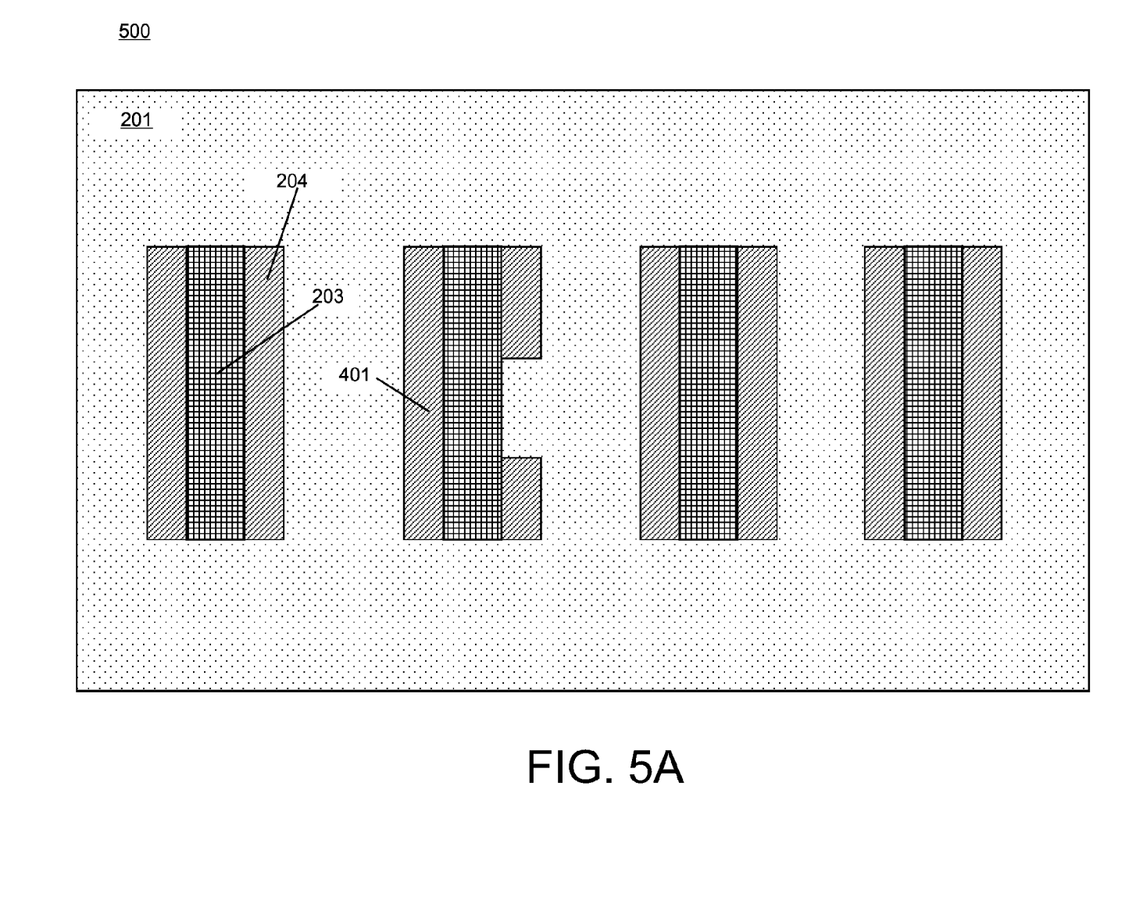
FIG. 5A is a top view of the device of FIG. 4A after removal of the cut mask.
Figure 5B:
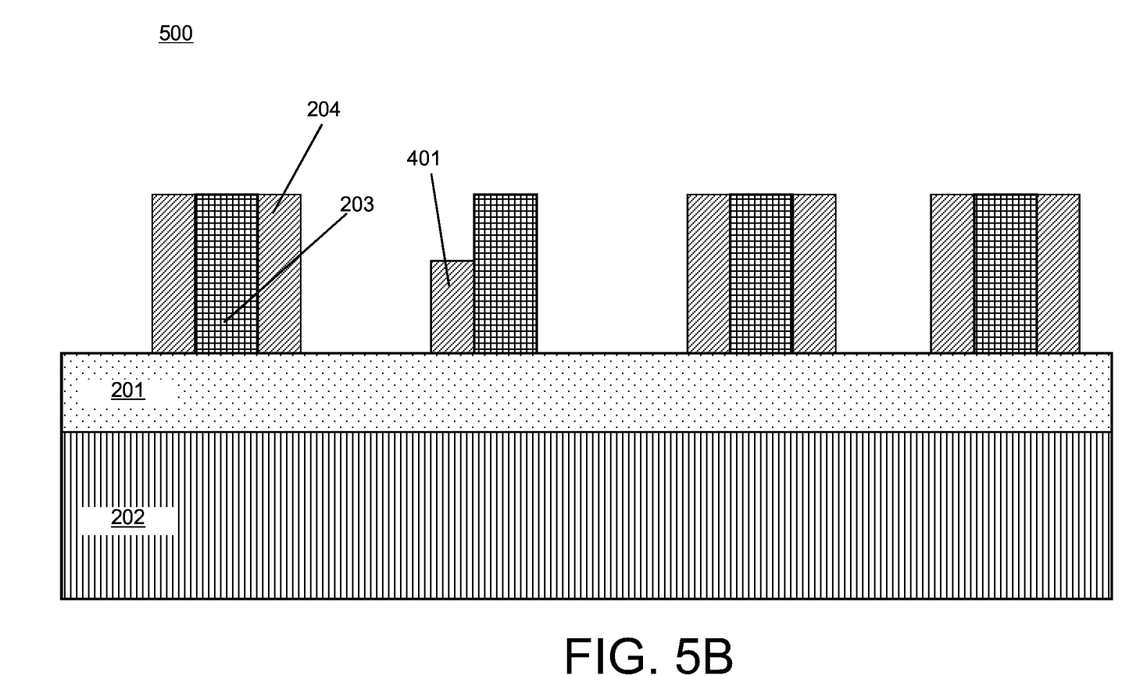
FIG. 5B is a cross section of the device of FIG. 4B after removal of the cut mask.
Figure 6A:
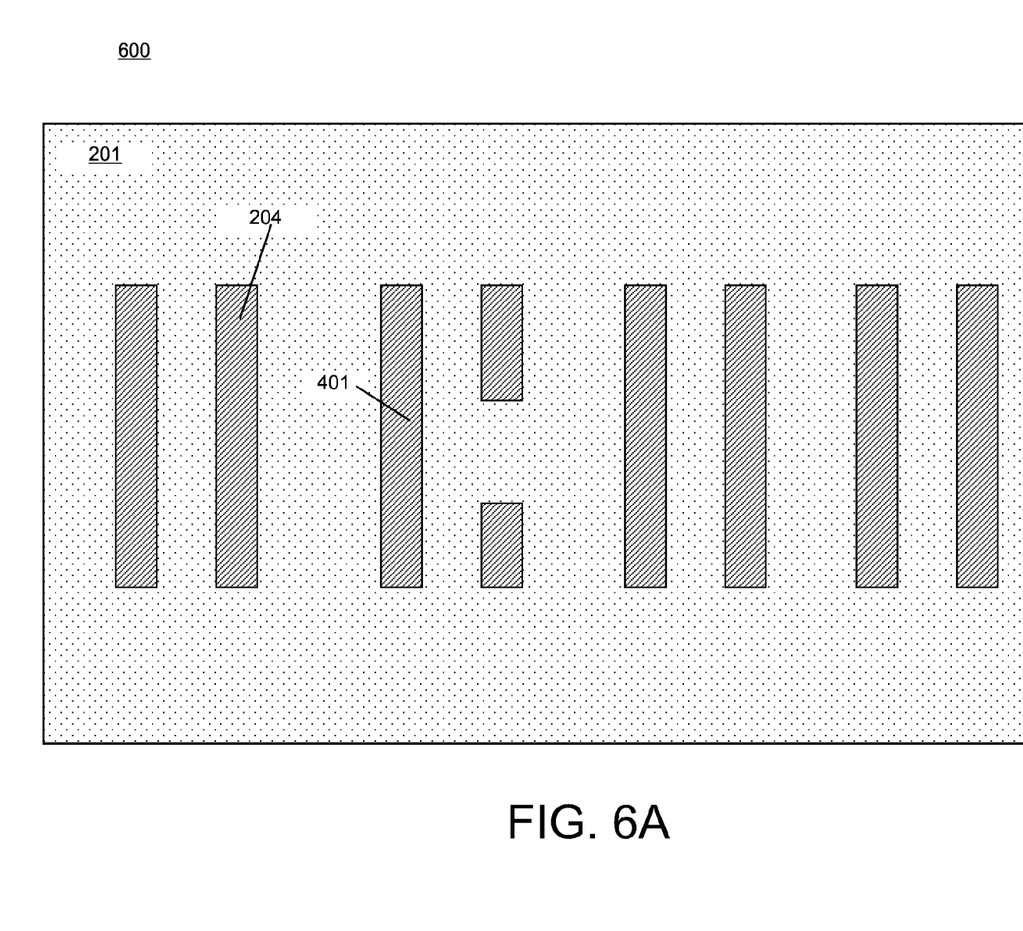
FIG. 6A is a top view of the device of FIG. 5A after removal of the mandrels.
Figure 6B:
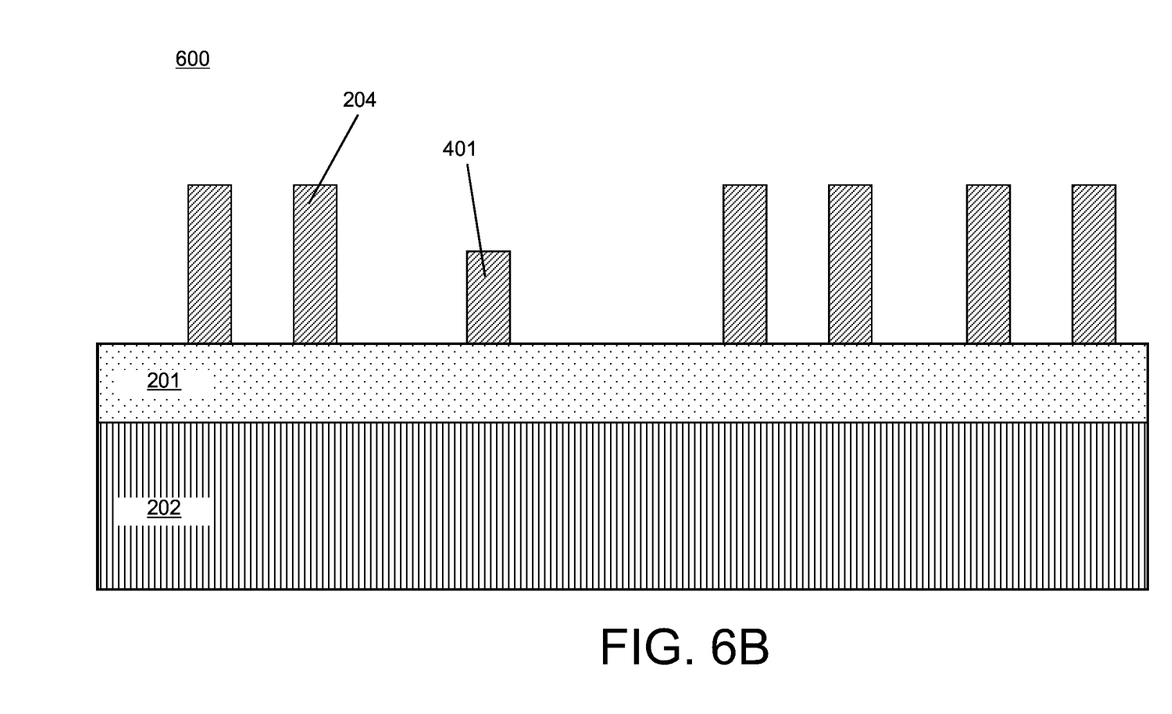
FIG. 6B is a cross section of the device of FIG. 5B after removal of the mandrels.

Returning now to FIG. 1, flow proceeds to block 104, in which the cut mask is removed from the device. The cut mask may be removed in any appropriate manner. For example, in the case that the cut mask comprise photoresist, it may be removed using a dry etch, such as ashing, or wet etch comprising sulfuric peroxide. FIGS. 5A and 5B show the device 400 of FIGS. 4A and 4B removal of the cut mask 301. The mandrels 203 and spacers 204/401 are left on the hardmask 201 after removal of the cut mask 301. As shown in FIG. 5B, partially removed spacer 401 is shorter than the spacers 204 that were protected by cut mask 301 during the spacer etch of block 103. Then, in block 105 of method 100, the mandrels are also removed. The mandrels may be removed in any appropriate manner; the technique used to remove the mandrels may depend on the material that comprises the mandrels. FIGS. 6A and 6B show the device 500 of FIGS. 5A and 5B after removal of the mandrels 203, leaving spacers 204 and partially removed spacer 401 on the hardmask 201.

Figure 7A:
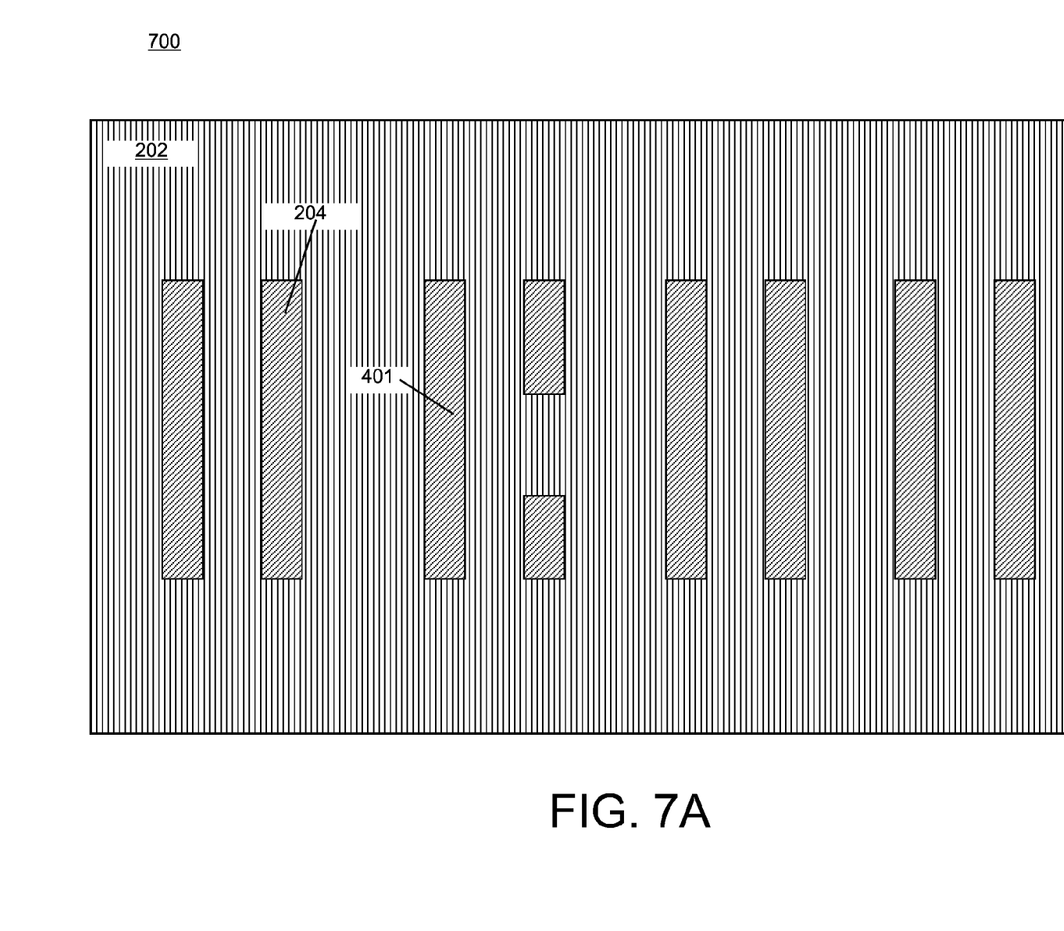
FIG. 7A is a top view of the device of FIG. 6A after fin structure formation.
Figure 7B:
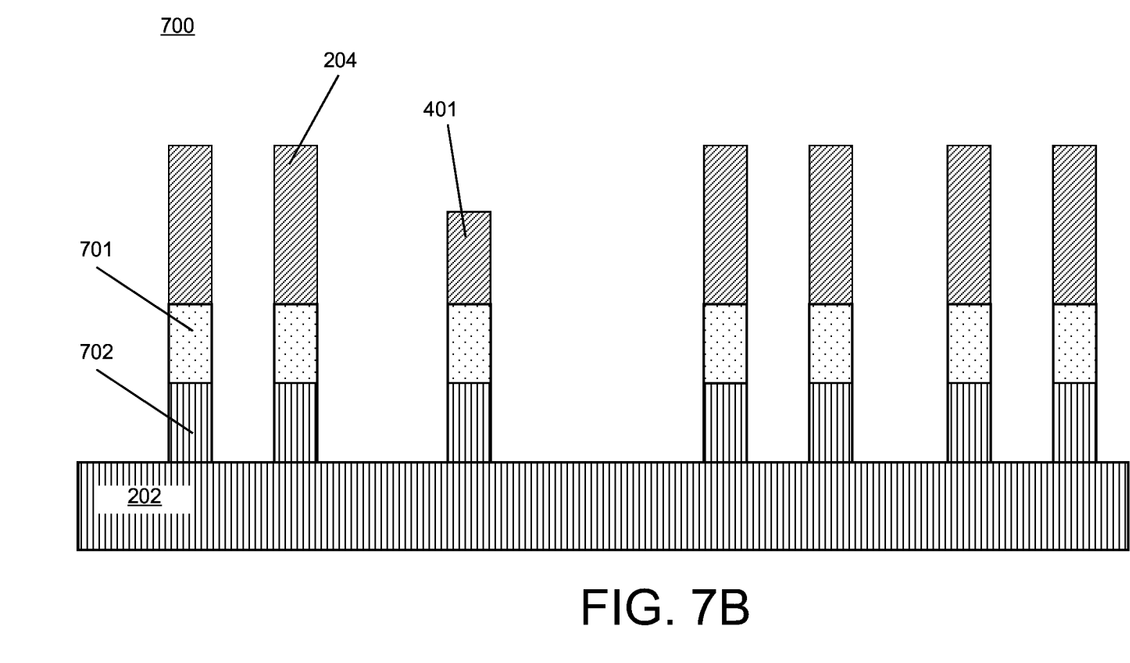
FIG. 7B is a cross section of the device of FIG. 6B after fin structure formation.

Next, in block 106 of FIG. 1, fin structures corresponding to the spacers are formed in the substrate. Fin structure formation as is performed in block 106 may comprise a two-step etch in some embodiments; first, the hardmask may be etched, using the spacers as a mask with a first etch chemistry, and then the substrate may be etched to form the fin structures in the substrate, using the etched hardmask as a mask with a second etch chemistry. In embodiments in which the substrate comprises bulk silicon, the height of the fin structures that are formed in block 106 may be determined by the etch time of the etch of the substrate. In embodiments in which the substrate comprises an SOI substrate, the height of the fin structures may be determined by the depth of a buried oxide (BOX) layer in the substrate. In embodiments in which the substrate comprises other semiconductor metal contacts, the metal contacts may be etched during fin structure formation to form fin structures comprising conductive lines. In further embodiments, the substrate may comprise gate or dielectric material that is etched during fin structure formation to form fin structures comprising gates or dielectric lines. FIGS. 7A and 7B show the device 600 of FIGS. 6A and 6B after etching of hardmask 201 and substrate 202 to form etched hardmask 701 and fin structures 702. The locations of fin structures 702 correspond to the locations of spacers 204/401. The fin structure 702 that is located underneath partially removed spacer 401 has the same dimensions as the fin structures 702 that are located underneath the other spacers 204. The fin structures 702 may comprise silicon fin structures, gates, conductive lines, or dielectric lines in various embodiments.

Figure 8A:
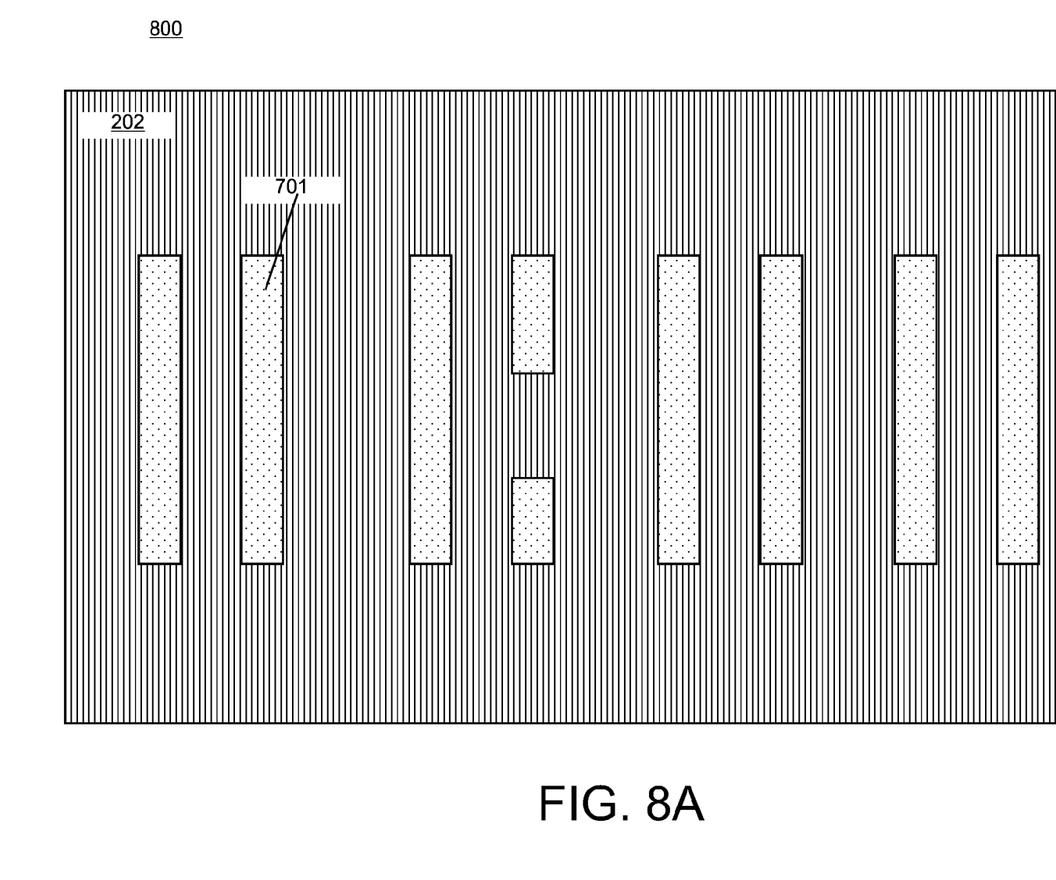
FIG. 8A is a top view of the device of FIG. 7A after spacer removal.
Figure 8B:
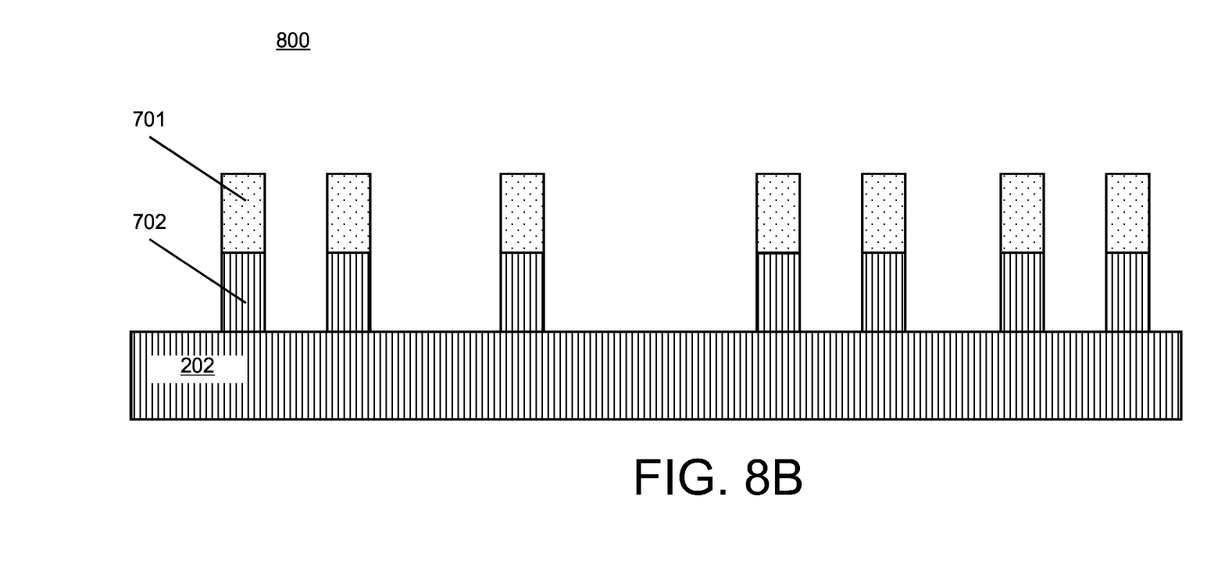
FIG. 8B is a cross section of the device of FIG. 7B after spacer removal.

Lastly, in block 107 of FIG. 1, the spacers are removed, leaving a semiconductor device with fin structures formed thereon. The spacers may be removed in any appropriate manner. FIGS. 8A and 8B show the device 700 of FIGS. 7A and 7B after removal of the spacers 204/401, leaving etched hardmask 701 and fin structures 702 on substrate 202. Any appropriate semiconductor processing steps may be subsequently applied to device 800 of FIGS. 8A and 8B, as necessary, to form a finished semiconductor device, such as a finFET.

The technical effects and benefits of exemplary embodiments include reduced effects due to misalignment of the cut mask in a semiconductor device that includes fin structures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming a semiconductor device, comprising:
    forming a mandrel on top of a substrate;
    forming a first spacer adjacent to the mandrel on top of the substrate;
    forming a second spacer on top of the substrate simultaneously with forming the first spacer;
    forming a cut mask over the first spacer and the mandrel, such that the first spacer is partially exposed by the cut mask and the second spacer is fully exposed by the cut mask;
    partially removing the partially exposed first spacer, and fully removing the second spacer during the partial removal of the partially exposed first spacer; and
    etching the substrate to form a fin structure corresponding to the partially removed first spacer in the substrate.

2. The method of claim 1, further comprising:
    removing the cut mask before removing the mandrel; and
    removing the mandrel after partially removing the first spacer and before forming the fin structure corresponding to the partially removed first spacer in the substrate.

3. The method of claim 1, wherein the mandrel comprises polysilicon or amorphous carbon, wherein the first spacer comprises nitride, a metal, or oxide, and wherein the cut mask comprises photoresist or spin-on-glass.

4. The method of claim 1, wherein partially removing the partially exposed first spacer comprises isotropically etching the partially exposed first spacer.

5. The method of claim 1, further comprising forming a hardmask over the substrate before forming the mandrel, wherein the mandrel and the first spacer are formed on the hardmask.

6. The method of claim 5, wherein the hardmask comprises oxide or nitride.

7. The method of claim 5, wherein forming the fin structure corresponding to the partially removed first spacer in the substrate comprises:
    etching the hardmask using the partially removed first spacer as a mask; and
    etching the substrate using the etched hardmask as a mask to form the fin structure in the substrate.

8. The method of claim 1, wherein the substrate comprises a metal, and wherein the fin structure comprises a conductive line comprising the metal.

9. The method of claim 1, wherein the substrate comprises a gate material, and wherein the fin structure comprises a gate.

10. The method of claim 1, wherein the substrate comprises a bulk silicon substrate or a silicon-on-insulator (SOI) substrate, and the fin structure comprises silicon.

11. The method of claim 1, wherein the substrate comprises an isolation region comprising a dielectric material, and wherein the fin structure comprises the dielectric material.

12. A method of forming a semiconductor device, comprising:
    forming a mandrel on top of a substrate;
    forming a first spacer adjacent to the mandrel on top of the substrate and forming a second spacer on top of the substrate simultaneously with forming the first spacer;
    forming a cut mask over the first spacer and the mandrel, such that the first spacer is partially exposed by the cut mask and forming the cut mask such that the second spacer is fully covered by the cut mask;
    partially removing the partially exposed first spacer; and etching the substrate to form a fin structure corresponding to the partially removed first spacer in the substrate;

wherein a width of the partially removed first spacer is the same as a width of the second spacer and a height of the partially removed first spacer is less than a height of the second spacer.

\* \* \* \* \*